US008836350B2

(12) United States Patent
Peter

(10) Patent No.: US 8,836,350 B2
(45) Date of Patent: Sep. 16, 2014

(54) CAPACITIVE TOUCH SENSING USING AN INTERNAL CAPACITOR OF AN ANALOG-TO-DIGITAL CONVERTER (ADC) AND A VOLTAGE REFERENCE

(75) Inventor: Dieter Peter, Wuppertal (DE)

(73) Assignee: Microchip Technology Incorporated, Chandler, AZ (US)

( * ) Notice: Subject to any disclaimer, the term of this patent is extended or adjusted under 35 U.S.C. 154(b) by 503 days.

(21) Appl. No.: 12/642,347

(22) Filed: Dec. 18, 2009

(65) Prior Publication Data

US 2010/0181180 A1 Jul. 22, 2010

Related U.S. Application Data

(60) Provisional application No. 61/148,598, filed on Jan. 30, 2009, provisional application No. 61/145,180, filed on Jan. 16, 2009.

(51) Int. Cl.
| | | |
|---|---|---|
| *G01R 27/26* | (2006.01) | |
| *H03K 17/955* | (2006.01) | |
| *H03K 17/96* | (2006.01) | |

(52) U.S. Cl.
CPC .. *H03K 17/955* (2013.01); *H03K 2217/960725* (2013.01); *H03K 2217/96073* (2013.01); *H03K 17/962* (2013.01)
USPC ........... 324/684; 324/658; 324/679; 345/173; 345/174; 345/168

(58) Field of Classification Search
USPC ....................................................... 324/684
See application file for complete search history.

(56) References Cited

U.S. PATENT DOCUMENTS

| | | | | |
|---|---|---|---|---|
| 4,039,940 A | * | 8/1977 | Butler et al. ................... | 324/678 |
| 4,299,153 A | * | 11/1981 | Hoskinson et al. ............. | 84/689 |
| 6,054,886 A | * | 4/2000 | Opris et al. .................... | 327/304 |
| 6,771,696 B1 | * | 8/2004 | Tuttle et al. .................... | 375/222 |

(Continued)

FOREIGN PATENT DOCUMENTS

| | | | | |
|---|---|---|---|---|
| EP | 1635147 A2 | 3/2006 | ............... | G01D 5/24 |
| EP | 1686543 A1 | 8/2006 | ............. | H03K 17/00 |

(Continued)

OTHER PUBLICATIONS

International PCT Search Report and Written Opinion, PCT/US2010/020617, 21 pages, Mailed Apr. 8, 2010.

(Continued)

*Primary Examiner* — Benjamin M Baldridge
(74) *Attorney, Agent, or Firm* — King & Spalding L.L.P.

(57) ABSTRACT

An internal sampling capacitor of an analog-to-digital converter (ADC) in a digital device is charged to a reference voltage, then some of the voltage charge on the internal sampling capacitor is transferred to an external unknown capacitor through a low resistance switch internal to the digital device. After the charge transfer has stabilized, the voltage charge remaining on the internal sampling capacitor is measured. The difference between the known reference voltage and the voltage remaining on the internal sampling capacitor is used to determine the capacitance value of the external capacitor. Alternatively, the external capacitor may be charged to a reference voltage then the external capacitor is coupled to the internal sampling capacitor, e.g., having no charge or a known charge on it, and the resulting voltage charge on the internal sampling capacitor is measured and used for determining the capacitance value of the external capacitor.

23 Claims, 8 Drawing Sheets

(56) References Cited

U.S. PATENT DOCUMENTS

| | | | |
|---|---|---|---|
| 6,879,930 B2* | 4/2005 | Sinclair et al. | 702/150 |
| 7,124,312 B2* | 10/2006 | Casebolt et al. | 713/323 |
| 7,592,819 B2* | 9/2009 | Kawate et al. | 324/679 |
| 7,804,307 B1* | 9/2010 | Bokma et al. | 324/663 |
| 7,906,976 B2* | 3/2011 | Remmers et al. | 324/686 |
| 2002/0067845 A1* | 6/2002 | Griffis | 382/107 |
| 2004/0004488 A1* | 1/2004 | Baxter | 324/678 |
| 2004/0263177 A1* | 12/2004 | Kaiser et al. | 324/453 |
| 2005/0134292 A1* | 6/2005 | Knoedgen | 324/658 |
| 2005/0240785 A1* | 10/2005 | Casebolt et al. | 713/300 |
| 2006/0017701 A1* | 1/2006 | Marten et al. | 345/173 |
| 2006/0082224 A1* | 4/2006 | Marshall et al. | 307/125 |
| 2007/0075710 A1* | 4/2007 | Hargreaves et al. | 324/658 |
| 2007/0164723 A1* | 7/2007 | Yanagisawa | 324/76.11 |
| 2008/0204049 A1* | 8/2008 | Kawate et al. | 324/679 |
| 2008/0206105 A1* | 8/2008 | Centanni | 422/82.01 |
| 2009/0021401 A1* | 1/2009 | Williams et al. | 341/24 |
| 2009/0033627 A1* | 2/2009 | Aasen | 345/168 |
| 2009/0184920 A1* | 7/2009 | Francis | 345/156 |
| 2010/0026655 A1* | 2/2010 | Harley | 345/174 |
| 2010/0079317 A1* | 4/2010 | Feddeler et al. | 341/120 |
| 2010/0283485 A1* | 11/2010 | Valisuo et al. | 324/663 |

FOREIGN PATENT DOCUMENTS

| | | | | |
|---|---|---|---|---|
| EP | 1583236 A1 | 10/2006 | | H03K 17/955 |
| EP | 1848111 A2 | 10/2007 | | H03K 17/96 |
| WO | 2006/133082 A1 | 12/2006 | | G01R 27/26 |
| WO | 2009/007500 A1 | 1/2009 | | G01R 27/26 |

OTHER PUBLICATIONS

European First Office Action, European Patent Application No. 10 700 359.2-2215, 5 pages, May 16, 2012.
Third European Office Action, Application No. 10700359.2, 4 pages, Jul. 3, 2013.

* cited by examiner

CAPACITIVE TOUCH SENSING USING AN INTERNAL CAPACITOR OF AN ANALOG-TO-DIGITAL CONVERTER (ADC) AND A VOLTAGE REFERENCE

RELATED PATENT APPLICATIONS

This application claims priority to commonly owned U.S. Provisional patent applications Ser. No. 61/148,598; filed Jan. 30, 2009; and Ser. No. 61/145,180; filed Jan. 16, 2009; both entitled "Capacitive Touch Sensing Using an Internal Capacitor of an Analog-To-Digital Converter (ADC) and a Voltage Reference," by Dieter Peter, and both are hereby incorporated by reference herein for all purposes.

TECHNICAL FIELD

The present disclosure relates to capacitive touch sensing, and more particularly, to capacitive touch sensing using a sampling capacitor that is part of (internal to) an analog-to-digital converter (ADC) and a voltage reference.

BACKGROUND

Detecting changes of capacitance is used for many applications such as level detection, proximity detection, touch keys, etc. There are various ways of detecting changes of capacitance, for example one is by using an oscillator. The oscillator may be a relaxation oscillator comprising a sensor capacitor in combination with other frequency determining components to generate a frequency. The other components, e.g., inductors, resistors, current sources, etc., used in the oscillator are assumed to be stable. The relaxation oscillator also uses a window comparator. The oscillation frequency is determined by the sensor capacitor, current value and the threshold voltages of the window comparator. When the capacitance of the sensor capacitor changes value, the frequency of the relaxation oscillator changes accordingly.

There are issues with using a relaxation oscillator in this way to detect changes in capacitance. One issue is that the measurement of a frequency requires some kind of reference time base. To detect small changes in capacitance, which is often the case, the reference, time base must be very stable and may require the use of a resonator or crystal in the reference time base measurement circuit so as to differentiate the small changes in frequency. An inexpensive internal resistor-capacitor oscillator does not have sufficient stability in this type of capacitance change detection circuit.

Another issue when using the relaxation oscillator for detection of changes in capacitance is the non-ideal behavior of the relaxation oscillator circuit. The window size of the comparator may change with temperature and operating voltage. The same is true for the currents set either by a resistor or a current source/sink.

The relaxation oscillator also generates electrical noise. This electrical noise can be reduced by making the sensor capacitor and the voltage amplitude on this capacitor as small as possible. Also since the waveform signal of the relaxation oscillator is triangular or close to being triangular shaped, it is rich in harmonics (multiples of the fundamental frequency). The fundamental and harmonics may present an electro-magnetic interference (EMI) problem.

Yet another issue with the relaxation oscillator is its sensitivity to external noise The relaxation oscillator has high impedance circuits by design, and may easily frequency synchronize to external signals.

The oscillator may be an inductor-capacitor (LC) oscillator, where the oscillator frequency depends partly upon the capacitance of the sensor capacitor. The LC oscillator has similar issues as the relaxation oscillator except that the oscillator frequency waveform is substantially sinusoidal, thus containing fewer and lower level harmonics than the relaxation oscillator. A stable time-base is still required, however, and the component costs will increase because of the required inductor and a more complicated oscillator circuit.

Another way of detecting changes of capacitance is by using a charge transfer technique. The sensor capacitor is charged with a voltage, and then the voltage, charge is transferred to an integrator which may be a larger value capacitor, or a more sophisticated circuit like an operational amplifier connected as an integrator. After a certain number of charge transfers the voltage on an integration capacitor of the integrator is determined which gives an indication of the ratio between the sensor capacitor (unknown capacitance) and the integration capacitor (known and stable capacitance value). Also instead of determining the voltage on the capacitor after a certain number of charge transfers, a continuous measurement may be implemented using charge balancing techniques.

Yet another way of detecting changes of capacitance is by using a current source to charge the sensor capacitor (unknown capacitance) and measure the time to reach a certain voltage or measure the reached voltage after a certain time period. To stay in "measurable" times for the "time at voltage" measurement or "settable" times for the "voltage at, time" measurement, the charging current becomes very low. The current source creates the same component stability issues as mentioned for the relaxation oscillator. These charge transfer techniques all require the use of an external capacitor as an, integrator. The oscillator circuits described hereinabove require specialized oscillator circuits and high stability time bases.

SUMMARY

Therefore what is needed is a way to determine small changes in capacitance without, requiring costly additional external components, high stability time bases, and/or oscillators with inherent EMI issues. This is accomplished, according to the teachings of this disclosure, by charging to a reference voltage an internal sampling capacitor of an analog-to-digital converter (ADC) in a digital device, then transferring some of the voltage charge on the internal sampling capacitor to an external unknown capacitor, e.g., touch sensor capacitor, through a low resistance switch internal to the digital device. After the charge transfer has stabilized, the voltage charge remaining on the internal sampling capacitor is measured. The difference between the known reference voltage and the voltage remaining on the internal sampling capacitor after charging the external capacitor (unknown capacitance value) from the initial reference voltage charge on the internal sampling capacitor is used in determining the capacitance value of the external capacitor or change thereof, and ultimately any capacitance change of the external capacitor, e.g., indicating capacitive touch sensor activation. Alternatively, the external capacitor may be charged to a reference voltage then the external capacitor is coupled to the internal sampling capacitor (e.g., having no charge or a known charge on it) and the resulting voltage charge on the internal sampling capacitor is measured and used for determining, the capacitance-value of the external capacitor or change thereof.

While sampling the external capacitor, the source impedance is low, and external, noise pickup will be minimized.

This increases noise immunity without requiring specialized hardware. Generated noise of an integrated circuit device is also low as any switching pulses are short in duration from an input-output of the integrated circuit device and may be easily filtered. If the reference voltage used to charge the internal, or external capacitor is derived from the same source as the voltage reference for the ADC conversion, errors are cancelled out. Stability over temperature and voltage is excellent.

If the external capacitor and the internal capacitor have substantially the same capacitance, the remaining voltage charge on the internal capacitor is half of the reference voltage that was used to charge the internal capacitor before it was subsequently coupled to the external capacitor, or visa versa. Therefore to maximize resolution, it is advantageous for the voltage used to charge the internal or external capacitor to be as high as possible, and a reference voltage used for the ADC be as low as possible. The voltage used to charge the capacitor may be the power supply voltage; e.g., Vcc or Vdd. The ADC reference voltage may be Vcc or Vdd, a fraction of Vcc or Vdd derived from an internal voltage divider, generated using an external voltage divider or a pulse width modulation (PWM) circuit, or using an internal absolute voltage reference, e.g., bandgap reference. Over-sampling may also be used to increase resolution of the ADC.

According to a specific example embodiment of this disclosure, a method for determining a capacitance of an external capacitor with an integrated circuit device, said method comprises the steps of charging from a voltage reference an internal capacitor in an integrated circuit device to a first voltage, wherein the internal capacitor has a known capacitance; measuring the first voltage with an analog-to-digital converter (ADC) in the integrated circuit device; discharging an external capacitor with a first switch in the integrated circuit device; coupling the internal capacitor to the external capacitor with a second switch in the integrated circuit device so that some of the charge on the internal capacitor is transferred to the external capacitor; measuring a second voltage on the internal capacitor with the ADC in the integrated circuit device; and calculating a capacitance of the external capacitor from the measured first voltage, the measured second voltage, and the known capacitance of the internal capacitor with a digital processor in the integrated circuit device.

According to another specific example embodiment of this disclosure, a method for determining a capacitance of an external capacitor with an, integrated circuit device, said method comprises the steps of: charging an internal capacitor in an integrated circuit device to a reference voltage, wherein the internal capacitor has a known capacitance; discharging an external capacitor with a first switch in the integrated circuit device; coupling the internal capacitor to the external capacitor with a second switch in the integrated circuit device so that some of the charge on the internal capacitor is transferred to the external capacitor; measuring a voltage on the internal capacitor with an analog-to-digital converter (ADC) in the integrated circuit device; and calculating a capacitance of the external capacitor from the reference voltage, the measured voltage on the internal capacitor, and the known capacitance of the internal capacitor with a digital processor in the integrated circuit device.

According to yet another specific example embodiment of this disclosure, a method for determining a capacitance of an external capacitor with an integrated circuit device, said method comprises the steps of: charging an external capacitor to a reference voltage; discharging an internal capacitor in an integrated circuit device, wherein the internal capacitor has a known capacitance; coupling the external capacitor to the internal capacitor with a switch in the integrated circuit device so that some of the charge on the external capacitor is transferred to the internal capacitor; measuring a voltage on the internal capacitor with an analog-to-digital converter (ADC) in the integrated circuit device; and calculating a capacitance of the external capacitor from the reference voltage, the measured voltage on the internal capacitor, and the known capacitance of the internal capacitor with a digital processor in the integrated circuit device.

According to still another specific example embodiment of this disclosure, a method for detecting a change in capacitance of an external capacitor with an integrated circuit device, said method comprises the steps of: (a) charging an internal capacitor in an integrated circuit, device to a reference voltage; (b) discharging an external capacitor with a first switch in the integrated circuit device; (c) coupling the internal capacitor to the external capacitor with a second switch in the integrated circuit device so that some of the charge on the internal capacitor is transferred to the external capacitor; (d) measuring a voltage on the internal capacitor with an analog-to-digital converter (ADC) in the integrated circuit device; (e) comparing the measured voltage on the internal capacitor to a previously measured voltage with a digital processor in the integrated circuit device, wherein if the measured voltage is substantially the same as the previously measured voltage then repeat steps (a) to (e) and if the measured voltage is different then the previously measured voltage then indicate with an output from the integrated circuit device that a change of capacitance of the external capacitor has occurred; and (f) continue to repeat steps (a) to (e).

According to another specific example embodiment of this disclosure, a method for detecting changes in capacitance of a plurality of external capacitors with an integrated circuit device, said method comprises the steps of: (a) charging an internal capacitor in an integrated circuit device to a reference voltage; (b) discharging an external capacitor(n) of a plurality of external capacitors with a first switch in the integrated circuit device, where n is an integer number from 0 to m; (c) coupling the internal capacitor to the external capacitor(n) with a second switch in the integrated circuit device so that some of the charge on the internal capacitor is transferred to the external capacitor(n); (d) measuring a voltage(n) on the internal capacitor with an analog-to-digital converter (ADC) in the integrated circuit device; (e) comparing the measured voltage(n) on the internal capacitor to a previously measured voltage(n) with a digital processor in the integrated circuit device, wherein if the measured voltage(n) is substantially the same as the previously measured voltage(n) then go to step (f), and if the measured voltage(n) is different then the previously measured voltage then indicate that a change of capacitance of the external capacitor(n) has occurred; (f) determining if n is equal to m, wherein if n is equal to m then make n zero (0), and if n is less than m then increment n by one (1); and (g) repeating steps (a) through (f).

According to another specific example embodiment of this disclosure, an apparatus for detecting actuation of capacitive touch sensor keys of a keypad, comprises: a keypad matrix: a plurality of capacitive touch sensor keys; an integrated circuit device comprising a multiplexer, a capacitive sensing circuit, a voltage reference, an analog-to-digital converter(ADC) and a digital processor; wherein (a) an internal capacitor of the ADC is charged to a reference voltage by the capacitive sensing circuit; (b) an external capacitor(n) of a plurality of capacitive touch sensor keys is discharged by the capacitive sensing circuit, where n is an integer number from 0 to m; (c) the internal capacitor of the ADC is coupled to the external capacitor(n) by the capacitive sensing circuit so that some of the charge on the internal capacitor is transferred to the external capacitor(n); (d) the ADC measures a voltage(n) on the internal capacitor; (e) the digital processor compares the measured voltage(n) on the internal capacitor to a previously measured voltage(n), wherein if the measured voltage(n) is substantially the same as the previously measured voltage(n) then go to (f), and if the measured voltage(n) is different then the previously measured voltage then an indication is made that a change of capacitance of the external capacitor(n) of the plurality of capacitive touch sensor keys has occurred; (f) if n is equal to m then make n zero (0), and if n is less than m then increment n by one (1); and (g) repeat (a) through (f).

BRIEF DESCRIPTION OF THE DRAWINGS

A more complete understanding of the present disclosure thereof may be acquired by referring to the following description taken in conjunction with the accompanying drawings wherein.

Figure 1:
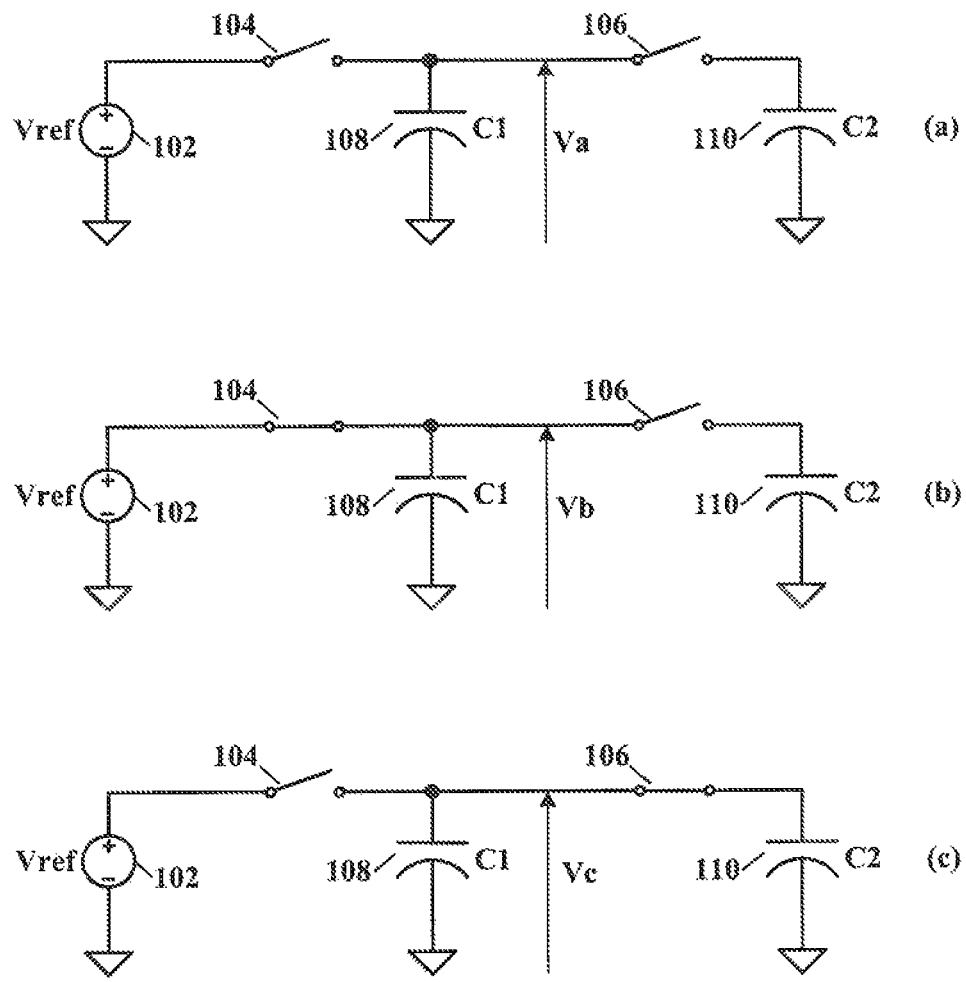
FIG. 1 illustrates schematic diagrams of internal and external capacitors being charged, according to teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted are schematic diagrams of internal and external capacitors being charged, according to teachings of this disclosure. Vref 102 is a voltage reference that may be a power supply voltage Vdd, a divided Vdd, an absolute voltage reference such as a bandgap reference, a logic, high level from a digital output, an external voltage reference, etc. The absolute value of Vref 102 is immaterial as will be explained hereinafter. A switch 104 couples the Vref 102 to, a known value internal capacitor 108, and switch 106 couples the internal capacitor 108 to an unknown value external capacitor 110. The term "internal" capacitor 108 refers to a capacitor within a digital device (e.g., digital devices 200, 300 and 400 shown in FIGS. 2, 3 and 4, respectively) and used with the circuits of the digital device, for various purposes, e.g., sampling capacitor of an analog-to-digital converter (ADC).

In the schematic diagram (a) shown in FIG. 1, both switches 104 and 106 are open and there is no voltage charge, Va=0 volts, on either of the capacitors 108 or 110. Shown in the schematic diagram (b), switch 10.4 is closed and Vref 102 is coupled to capacitor 108. Capacitor 108 is thereby charged by a voltage, Vb, from Vref 102, wherein the charge on the capacitor 108 is Q=CV, where Q is the charge in coulombs, C is the capacitance in farads of the capacitor 108, and V is the potential in volts (Vb).

Shown in the schematic diagram (c), switch 104 is open and switch 106 is closed, thereby transferring some of the charge Q on capacitor 108 to capacitor 110. The charge Q remains the same but is now distributed between the two capacitors 108 and 110. The voltage Vc is now less because the combined capacitance C of the capacitors 108 and 110 in parallel is larger. The capacitance value of capacitor 110 may now be easily determined from the measured voltages Vb and Vc, and known capacitance value of capacitor 108 as follows:

$$Q=C1*Vb$$

$$Q=(C1+C2)*Vc$$

$$C1*Vb=(C1+C2)*Vc$$

$$C2*Vc=C1*(Vb-Vc)$$

$$C2=C1*(Vb-Vc)/Vc$$

These calculations may be easily performed with a digital processor receiving digitized values of Vb and Vc from an analog-to-digital converter (ADC), and using the known capacitance value of the capacitor 108. Also advantageous is observing when there is merely a change in the capacitance value of the capacitor 110. For example, when a capacitance value of the capacitor 110 is at a first value for a first condition, e.g., capacitive touch sensor not activated, and at a second value for a second condition, e.g., capacitive touch sensor activated, there will be a change in the voltage value Vc. By remembering the previously measured voltage value, Vc and comparing it to a presently measured voltage value Vc, any change of the voltage value Vc over a certain difference (percent change) will indicate that a particular capacitive touch sensor has been activated once a base voltage value Vc has been established and memorized (stored in memory). Whether the capacitive touch sensor increases or decreases its capacitance value when actuated is immaterial, so long as a change in the voltage value Vc (decrease or increase) is detected from a previously determined un-actuated condition, according to the teachings of this disclosure.

Figure 2:
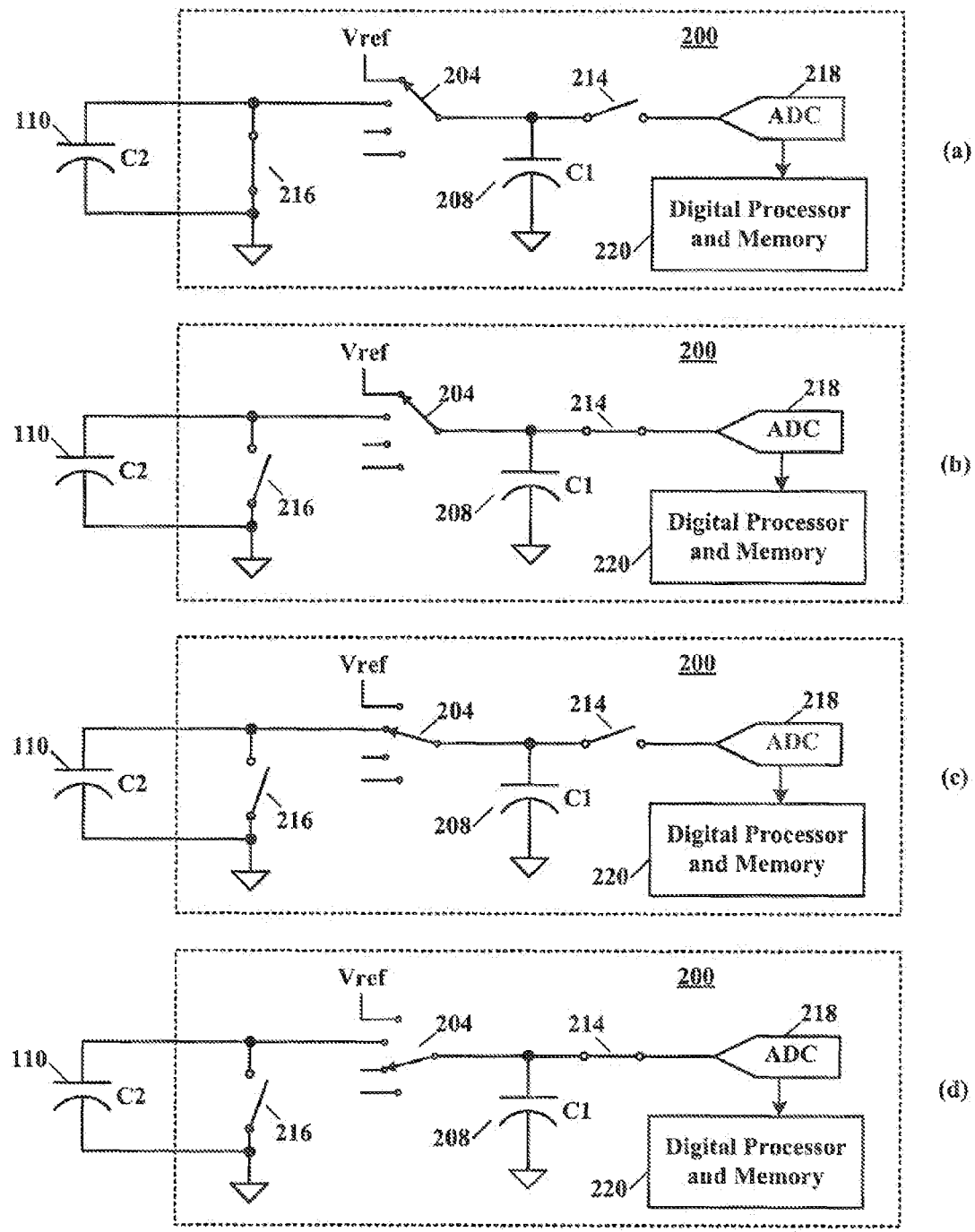
FIG. 2 illustrates schematic diagrams of internal and external capacitors being charged and voltages measured of the internal capacitor in determining capacitance of the external capacitor, according to a specific example embodiment of this disclosure.

Referring to FIG. 2, depicted are schematic diagrams of internal and external capacitors being charged and voltages measured of the internal capacitor in determining capacitance of the external capacitor, according to a specific example embodiment of this disclosure. An integrated circuit device 200 comprises an analog-to-digital converter (ADC) 218, a digital processor 220; a sampling capacitor 208 having, a known value of capacitance, and switches 204, 214 and 216. An external capacitor 110 having an unknown value is coupled to the integrated circuit device 200 as shown. Vref is a voltage reference (e.g., Vref 102 of FIG. 1) that may be a power supply voltage Vdd, a divided Vdd, an absolute voltage reference such as a bandgap reference, a logic high level from a digital output, an external voltage reference, etc. The integrated circuit device 200 may be, for example but is not limited to, a microcontroller, microprocessor, digital signal processor, application specific integrated circuit, programmable logic array, etc.

In the schematic diagram (a) shown in FIG. 2, switch 216 is closed to remove any charge that may be on the external capacitor 110, switch 204 is in a position that couples Vref to the internal capacitor 208, thereby charging it to a voltage of the Vref, and switch 214 is open, decoupling capacitor 208 from the input to the ADC 218. In the schematic diagram (b), switch 216 is open and, switch 214 is closed so that the ADC 218 can convert the voltage of the Vref to a digital value to be sent to the digital processor 220. This step is optional since knowledge of the absolute value of the voltage from Vref may not be required when only detecting, a change in the capacitance of the external capacitor 110.

In the schematic diagram (c), switch 204 is in a position that couples the internal capacitor 208 to the external capacitor 110, thereby transferring some of the charge on the capacitor 208 to the external capacitor 110. When this happens the charge voltage remaining on the capacitor 208 is reduced. In the schematic diagram (d), switch 204 is in a position that decouples the internal capacitor 208 from the external capacitor 110 and couples the capacitor 208 back to the input of the ADC 218 wherein a new voltage sample is taken and converted to a digital representation sent to the digital processor 220. The digital processor 220 may then determine the capacitance value of the capacitor 110 from the known capacitance value of the internal capacitor 208 and the two voltages sampled in the schematic diagrams (b) and (d). If determination of just a change in the capacitance value of the capacitor 110 is required then the sampling step of schematic diagram (b) is not required. The only requirement is that the digital processor remember the previous voltage sample taken in the schematic diagram (d) and compare that previous voltage sample with a present voltage sample taken in the schematic diagram (d), and when there is sufficient difference between the previous and present voltage samples, this indicates that a change in the capacitance of the external capacitor 110 has occurred.

The internal capacitor 208 and the switch 214 may be part of the ADC 218 in the integrated circuit device 200. It is contemplated and with the scope of this disclosure that many different configurations of switching between the capacitors 208 and 110, the voltage reference, Vref, and the ADC 218 are possible, and one having ordinary skill in the art of digital circuits and having the benefit of this disclosure would easily understand how to implement such circuits. The switch 216 may be a digital output driver and the switch 204 may be an internal multiplexer, both in the integrated circuit device 200.

Figure 3:
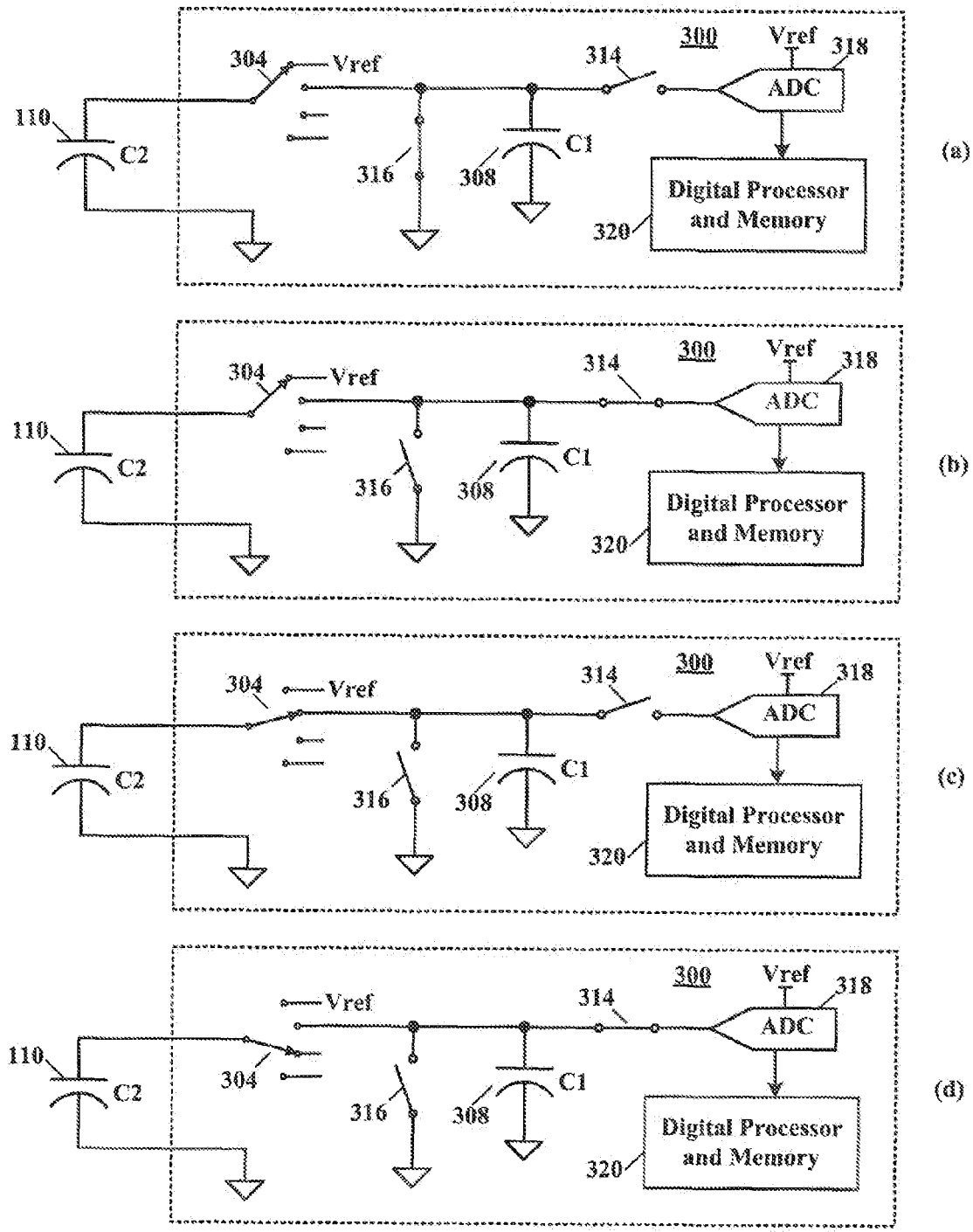
FIG. 3 illustrates schematic diagrams of internal and external capacitors being charged and voltages measured of the internal capacitor in determining capacitance of the external capacitor, according to another specific example embodiment of this disclosure.

Referring to FIG. 3, depicted are schematic diagrams of internal and external capacitors being charged and voltages measured of the internal capacitor in determining capacitance of the external capacitor, according to another specific example embodiment of this disclosure. An integrated circuit device 300 comprises an analog-to-digital converter (ADC) 318, a digital processor 320, a sampling capacitor 208 having a known value of capacitance, and switches 304, 314 and 316. An external capacitor 110 having an unknown value is coupled to the integrated circuit device 300 as shown. Vref is a voltage reference (e.g., Vref 102 of FIG. 1) that may be a power supply voltage Vdd, a divided. Vdd, an absolute voltage reference such as a bandgap reference, a logic high level from a digital output, an external voltage reference, etc. The integrated circuit device 300 may be, for example but is not limited to, a microcontroller, microprocessor, digital signal processor, application specific integrated circuit, programmable logic array, etc.

In the schematic diagram (a) shown in FIG. 3, switch 316 is closed to remove any charge that may be on the internal capacitor 308, switch 304 is in a position that couples Vref to the external capacitor 110, thereby charging it to a voltage of the Vref, and switch 314 is open, decoupling capacitor 308 from the input to the ADC 318. In the schematic diagram (b), switch 31.6 is open and switch 314 is closed so that the ADC 318 can convert any voltage on the internal capacitor 308 to, a digital value to be sent to the digital processor 320 (normally the voltage will be zero due to switch 316 shorting capacitor 308). This step is optional since knowledge of the absolute value of a voltage or lack thereof on the internal, capacitor 308 may not be required when only detecting a change in the capacitance of the external capacitor 110.

In the schematic diagram (c), switch 304 is in a position that couples the external capacitor 110 to the internal capacitor 308, thereby transferring some of the charge on the external capacitor 110 to the internal capacitor 308. When this happens the charge voltage remaining on the external capacitor 110 is reduced. In the schematic diagram (d), switch 304 is in a position that decouples the external capacitor 110 from the internal capacitor 308 and switch 314 couples the capacitor 308 back to the input of the ADC 218 wherein a voltage sample is taken and converted to a digital representation sent to the digital processor 320. The digital processor 320 may then determine the capacitance value of the capacitor 110 from the known capacitance value of the internal capacitor 308, the known Vref voltage value, and the voltage sampled in the schematic diagram (d). If determination of just a change in the capacitance value of the capacitor 110 is required then the sampling step of schematic diagram (b) is not required. The only requirement is that the digital process or remember the previous voltage sample, taken in the schematic diagram (d) and compare that previous voltage sample with a present voltage sample taken in the schematic diagram (d), and when there is sufficient difference between the previous and present voltage samples, this indicates that a change in the capacitance of the external capacitor 110 has occurred.

The internal capacitor 308 and the switch 314 may be part of the ADC 318 in the integrated circuit device 300. It is contemplated and with the scope of this disclosure that, many different configurations of switching between the capacitors 308 and 110, the voltage reference, Vref, and the ADC 318 are possible, and one having ordinary skill in the art of digital circuits and having the benefit of this disclosure would easily understand how to implement such circuits. The switch 316 may be a digital output driver and the switch 304 may be an internal multiplexer, both in the integrated circuit device 300.

Figure 4:
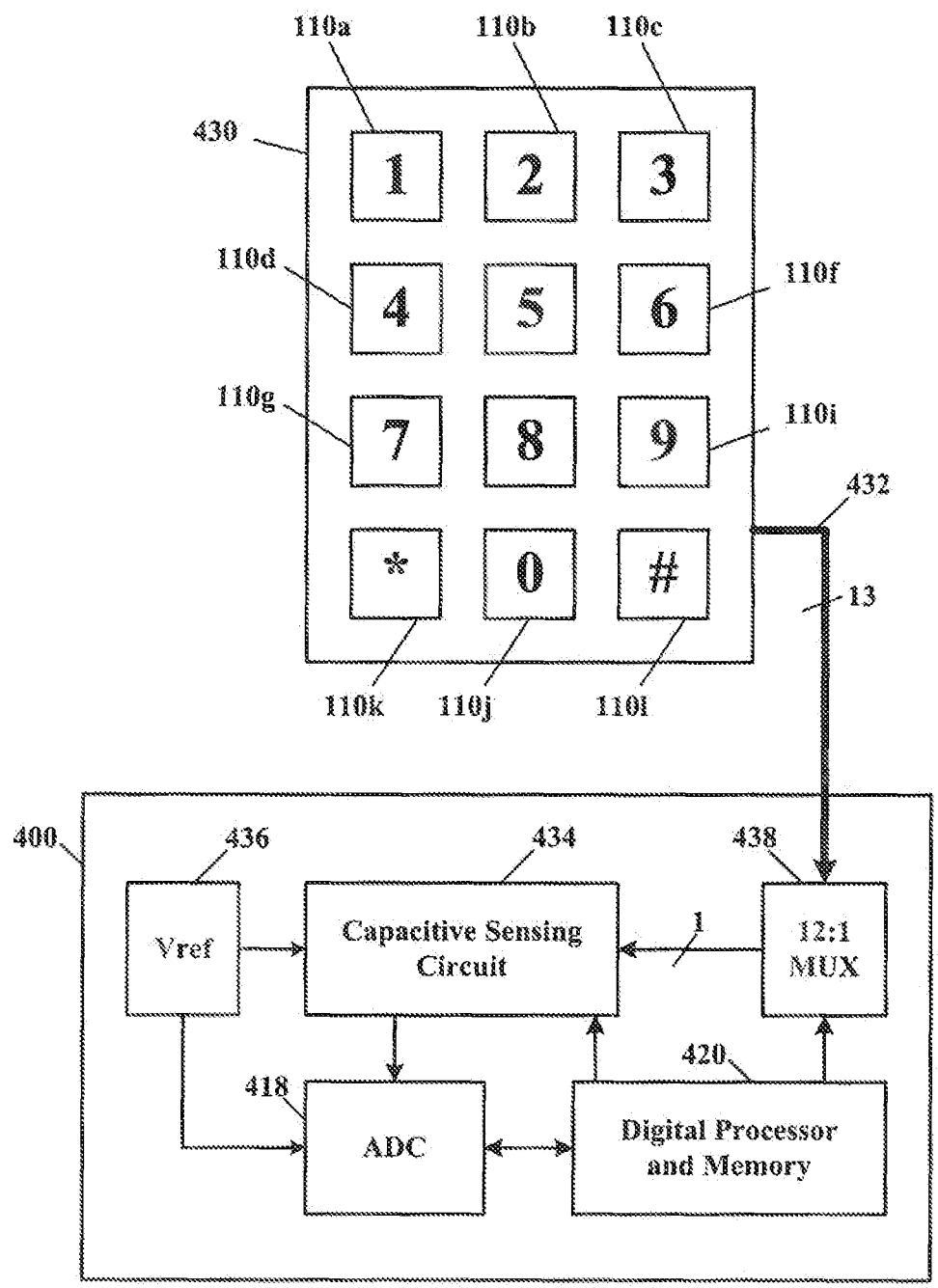
FIG. 4 illustrates a schematic block diagram of a capacitive touch keypad, and integrated circuit interface and processor for the capacitive touch keypad, according to yet another specific example embodiment of this disclosure.

Referring to FIG. 4, depicted is a schematic block diagram of a capacitive touch keypad, and integrated circuit interface and processor for the capacitive touch keypad, according, to yet another specific example embodiment of this disclosure. A capacitive touch keypad 430 comprises a plurality of capacitive touch sensor keys 110. Each of the plurality of capacitive touch, sensor keys 110 will change capacitance value when actuated, e.g., touched or depressed. Each of the plurality of capacitive touch sensor keys 110 is coupled to the multiplexer 438 of the integrated circuit device 400 through a bus 432. Other forms of multiplexing the capacitive touch sensor keys 110 to the integrated circuit device 400 are contemplated herein and would be readily apparent to one having ordinary skill in the art of integrated circuit design and having the benefit of this disclosure. The integrated circuit device 400 may be, for example but is not limited to, a microcontroller, microprocessor, digital signal processor, application specific integrated circuit, programmable logic array, etc.

The integrated circuit device 400 comprises a voltage reference 436 that may be a power supply voltage Vdd, a divided Vdd, an absolute voltage reference such as a bandgap reference, a logic high level from a digital output, an external voltage reference, etc., a capacitive sensing circuit 434, such as more fully described in FIG. 2 or 3, an analog-to-digital converter (ADC) 418, a multiplexer 438, and a digital processor 420, e.g., microcontroller, microprocessor, digital signal processor, application specific integrated circuit, programmable logic array, etc. The multiplexer 438, capacitive sensing circuit 434 and ADC 418 are controlled by the digital processor 420. The multiplexer 438 scans the keypad 430 by selecting each of the plurality of capacitive touch sensor keys 110 for determination of the capacitance value thereof, or a change in voltage measured from a previous scan. The digital processor 420 includes memory that may be used to store the capacitance and/or voltage value for each of the plurality of capacitive touch sensor keys 110 from previous measurements, and then use each of these stored capacitance and/or voltage values to determine when a change thereof occurs. Any change in capacitance/voltage value indicates that the respective capacitive touch sensor key 110 is actuated.

Figure 5:
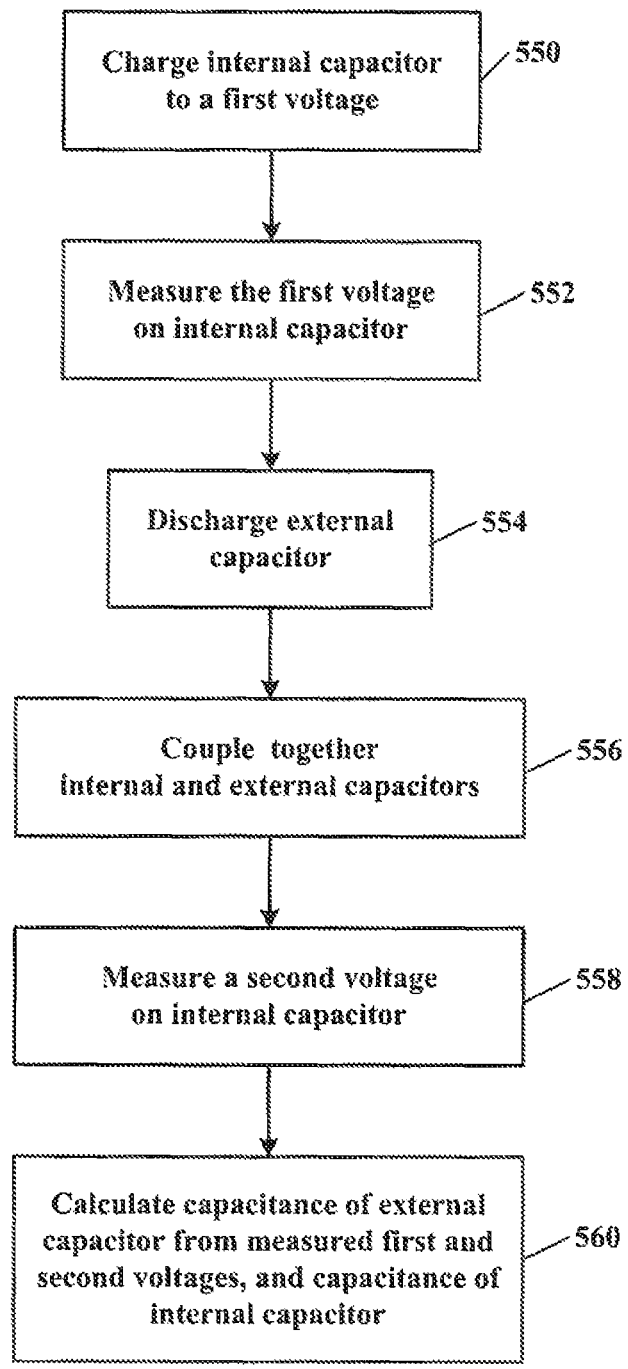
FIG. 5 illustrates a schematic process flow diagram of a specific example embodiment, for operation of the circuit shown in FIG. 2.

Referring to FIG. 5, depicted is a schematic process flow diagram of a specific example embodiment for operation of the circuit shown in FIG. 2. The internal capacitor 208 is charged to a first voltage, e.g., Vref, in step 550. The first voltage charge on the internal capacitor 208 is measured in step 552. The external capacitor 110 is discharged in step 554. The internal capacitor 208 and external capacitor 110 are coupled together for transferring charge therebetween in step 556. A second voltage charge on the internal capacitor 208 is measured in step 558. In step 560 the capacitance of the external capacitor 110 is calculated from the known values of the capacitance of the internal capacitor 208, the first measured voltage and the second measured voltage, according to the formula: C2=C1*(Vb−Vc)/Vc, where C2 is the capacitance of the external capacitor 110, C1 is the capacitance of the internal capacitor 208, Vb is the measured first voltage, and Vc is the measured second voltage.

Figure 6:
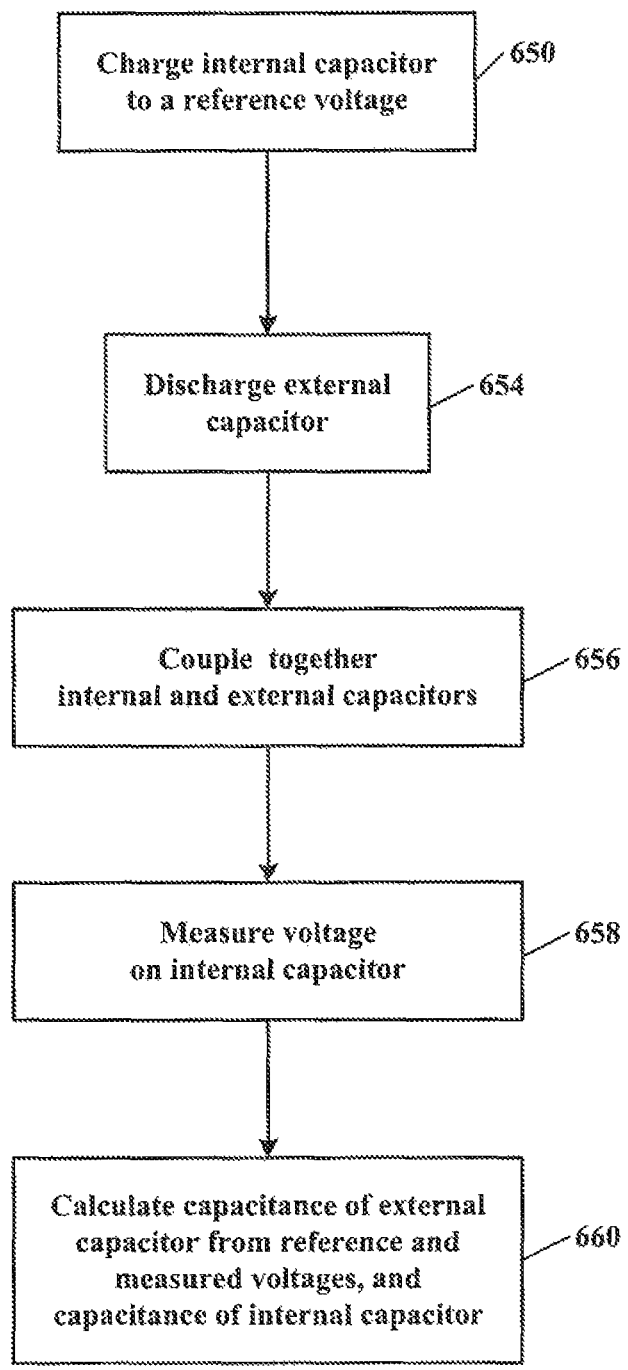
FIG. 6 illustrates a schematic process flow diagram of another specific example embodiment for operation of the circuit shown in FIG. 2.

Referring to FIG. 6, depicted is a schematic process flow diagram Of another specific example embodiment for operation of the circuit shown in FIG. 2. The internal capacitor 208 is charged to a reference voltage in step 650. The external capacitor 110 is discharged in step 654. The internal capacitor 208 and external capacitor 110 are coupled together for transferring charge therebetween in step 656. Then a voltage charge on the internal capacitor 208 is measured in step 658. In step 660, the capacitance of the external capacitor 110 is calculated from the known values of the capacitance of the internal capacitor 208, the reference voltage and the measured voltage from step 658, according to the formula: C2=C1*(Vb−Vc)/Vc, where C2 is the capacitance of the external capacitor 110, C1 is the capacitance of the internal capacitor 208, Vb is the reference voltage, and Vc is the measured voltage of the internal capacitor 208 after the internal capacitor 208 and external capacitor 110 were coupled together.

Figure 7:
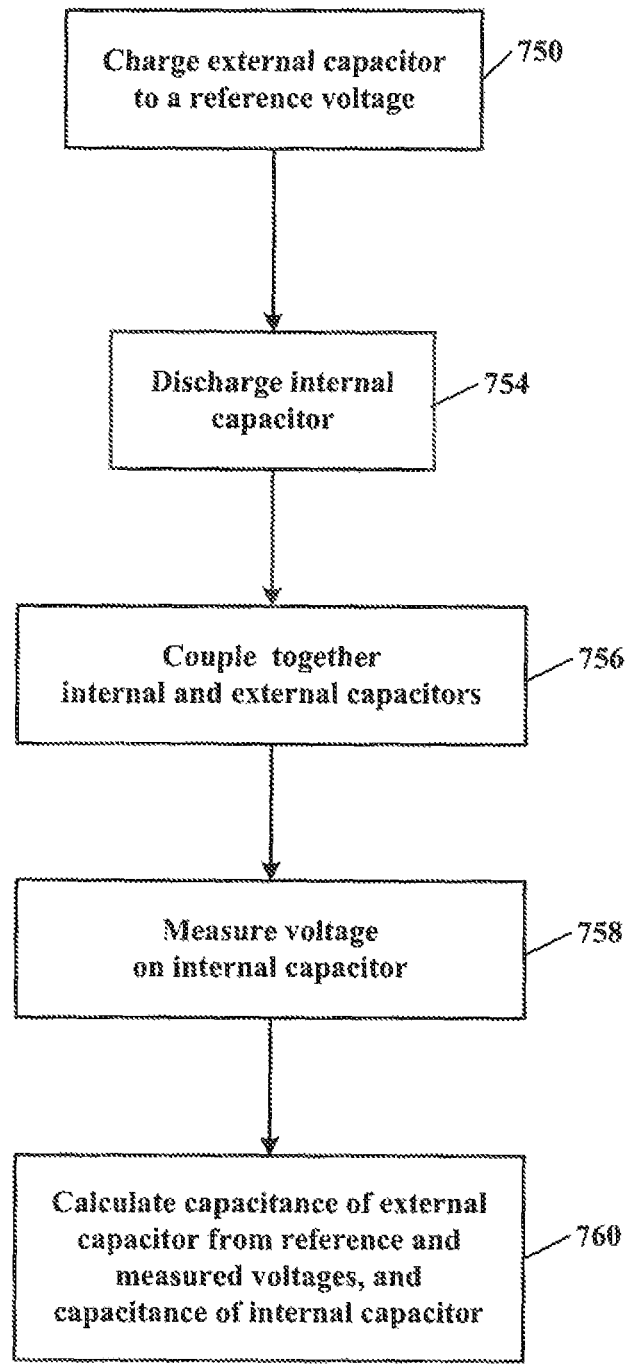
FIG. 7 illustrates a schematic process flow diagram of a specific example embodiment for operation of the circuit shown in FIG. 3.

Referring to FIG. 7, depicted is a schematic process flow diagram of another specific example embodiment for operation of the circuit shown in FIG. 3. The external capacitor 110 is charged to a reference voltage in step 750. The internal capacitor 308 is discharged in step 754. The internal capacitor 308 and external capacitor 110 are coupled together for transferring charge therebetween in step 756. A voltage charge on the internal capacitor 308 is measured in step 758. In step 760, the capacitance of the external capacitor 110 is calculated from the known values of the capacitance of the internal capacitor 308, the reference voltage and the measured voltage from step 858, according to the formula: C2=C1*(Vb−Vc)/Vc, where C2 is the capacitance of the external capacitor 110, C1 is the capacitance of the internal capacitor 308, Vb is the reference voltage, and Vc is the measured voltage of the internal capacitor 308 after the internal capacitor 308 and external capacitor 110 were coupled together.

Figure 8:
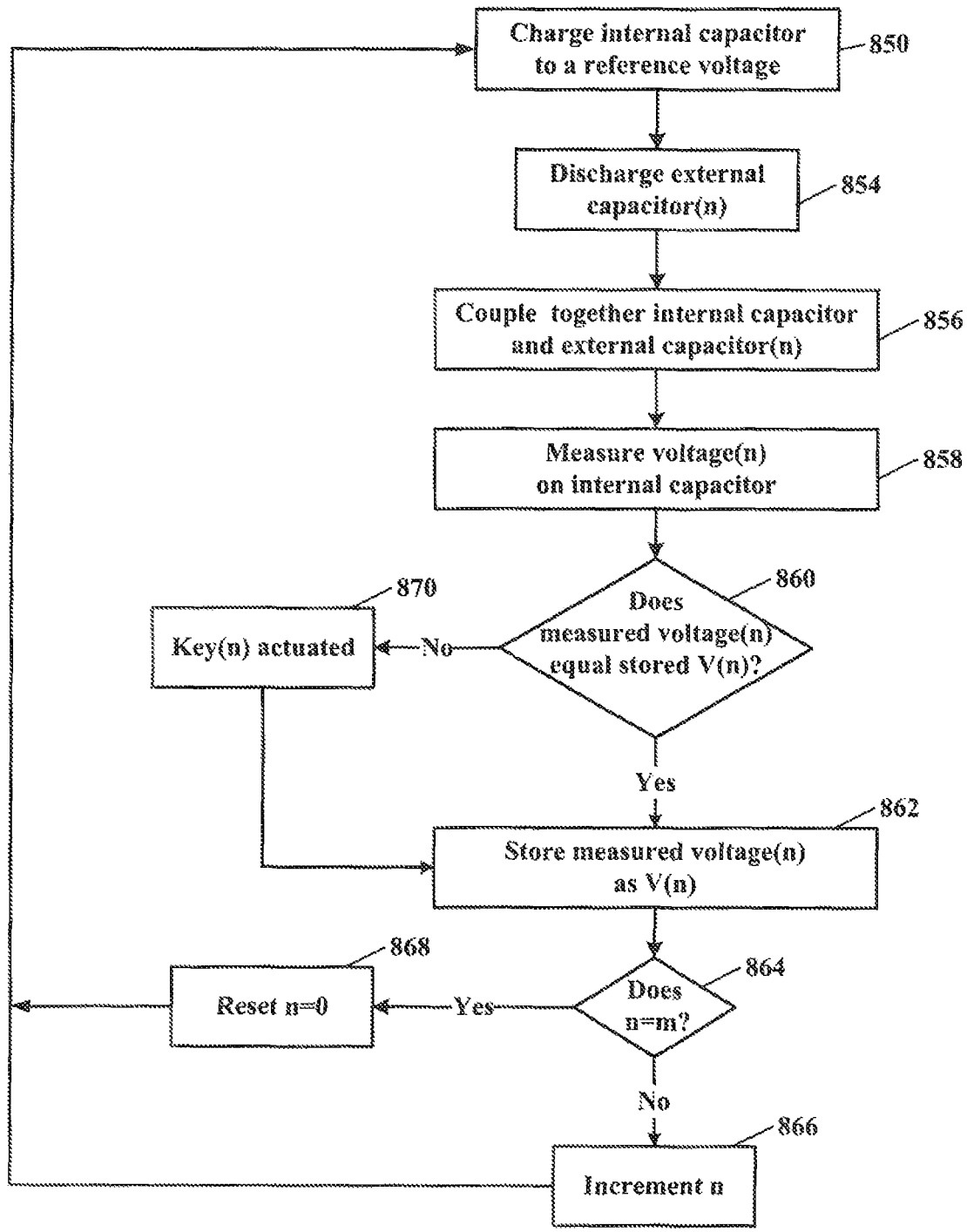
FIG. 8 illustrates a schematic process flow diagram of a specific example embodiment for operation of the circuit shown in FIG. 4.

Referring to FIG. 8, depicted is a schematic process, flow diagram of a specific example embodiment for operation of the circuit shown in FIG. 4. An internal capacitor is charged to a reference voltage in step 850. An external, capacitor(n), capacitive touch, sensor key 110n (FIG. 4), where n an integer value from 0 to m, is discharged in step 854. The internal capacitor and the external capacitor(n) are coupled together in step 856. A voltage(n) on the internal capacitor is measured in step 858. Step 860 determines whether the measured voltage(n) is substantially equal to a stored voltage(n) that was previously measured. If the measured and stored voltages(n) are different then the external capacitor(n) has changed value, e.g., capacitive touch sensor key 110n (FIG. 4) is actuated, and a notification thereof is generated in step 870. If the measured and stored voltages(n) are substantially the same then the external capacitor(n) has not changed value, e.g., capacitive touch sensor key 110n is not actuated. Step 864 determines whether all of the external capacitors(n) to m): have been scanned (read, etc) and if n=m then step 868 resets n=0, otherwise, n is incremented by one (1) in step 866. The aforementioned sequence of operations and voltage measurements may continuously repeat so that there will be detection of any actuated key(n) 110.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for determining a capacitance of an external capacitor with an integrated circuit device, said method comprising the steps of:

using only a sample and hold capacitor of an analog-to-digital converter (ADC) within the integrated circuit device to measure a sensor capacitor having a first electrode connected with an external pin of the integrated circuit device, wherein a measurement is performed by the following steps:

charging from a voltage reference within the integrated circuit device the sample and hold capacitor to a first voltage by connecting the voltage reference with the single internal capacitor, wherein the sample and hold capacitor has a known capacitance;

while keeping the voltage reference connected to the sample and hold capacitor, measuring a first voltage on the sample and hold capacitor with the ADC;

discharging the external capacitor with a first switch in the integrated circuit device;

disconnecting the voltage reference and coupling the sample and hold capacitor to the external capacitor with a second switch in the integrated circuit device so that some of the charge on the sample and hold capacitor is transferred to the external capacitor;

de-coupling the sample and hold capacitor from the external capacitor and measuring a second voltage across the internal capacitor with the ADC in the integrated circuit device; and calculating a capacitance of the external capacitor from the measured first voltage, the measured second voltage, and the known capacitance of the sample and hold capacitor with a digital processor in the integrated circuit device.

2. The method according to claim 1, wherein the capacitance of the external capacitor is equal to a difference between the first and second voltages divided by the second voltage and multiplied by the capacitance of the sample and hold capacitor.

3. The method according to claim 1, wherein the integrated circuit device is a microcontroller.

4. A method for determining a capacitance of an external capacitor with an integrated circuit device, said method comprising the steps of:

using only a sample and hold capacitor of an analog-to-digital converter (ADC) within the integrated circuit device to measure an external capacitance by the steps of:

coupling a first terminal of an sample and hold capacitor of an analog-to-digital converter within an integrated circuit device with a reference voltage while grounding a second terminal of the sample and hold capacitor, wherein the sample and hold capacitor has a known capacitance;

discharging the external capacitor with a first switch in the integrated circuit device;

coupling the first terminal of the sample and hold capacitor with a first terminal of the external capacitor with a second switch in the integrated circuit device while a second terminal of the external capacitor is grounded so that some of the charge on the sample and hold capacitor is transferred to the external capacitor;

de-coupling the sample and hold capacitor from the external capacitor and measuring a voltage on the first terminal of the sample and hold capacitor with the ADC in the integrated circuit device; and calculating a capacitance of the external capacitor from the reference voltage, the measured voltage on the sample and hold capacitor, and the known capacitance of the sample and hold capacitor with a digital processor in the integrated circuit device.

5. The method according to claim 4, wherein the capacitance of the external capacitor is equal to a difference between the reference and measured voltages divided by the measured voltage and multiplied by the capacitance of the sample and hold capacitor.

6. The method according to claim 4, wherein the reference voltage is selected from the group consisting of a power supply voltage, a divided power supply voltage, an external voltage reference, and a bandgap voltage reference.

7. The method according to claim 4, wherein the integrated circuit device is a microcontroller.

8. A method for determining a capacitance of an external capacitor with an integrated circuit device, said method comprising the steps of:

using only a sample and hold capacitor or an analog-to-digital converter (ADC) within the integrated circuit device to measure an external capacitance by the steps of:

coupling a first terminal of an external capacitor with a reference voltage while grounding a second terminal of the external capacitor;

discharging the sample and hold capacitor, wherein the sample and hold capacitor has a known capacitance;

coupling the first terminal of the external capacitor with a first terminal of the sample and hold capacitor with a switch in the integrated circuit device while grounding a second terminal of the sample and hold capacitor so that some of the charge on the external capacitor is transferred to the sample and hold capacitor;

de-coupling the sample and hold capacitor from the external capacitor and measuring a voltage on the first terminal of the sample and hold capacitor with an analog-to-digital converter (ADC) in the integrated circuit device; and calculating a capacitance of the external capacitor from the reference voltage, the measured voltage on the sample and hold capacitor, and the known capacitance of the sample and hold capacitor with a digital processor in the integrated circuit device.

9. The method according to claim 8, wherein the capacitance of the external capacitor is equal to a difference between the reference and measured voltages divided by the measured voltage and multiplied by the capacitance of the sample and hold capacitor.

10. The method according to claim 8, wherein the reference voltage is selected from the group consisting of a power supply voltage, a divided power supply voltage, an external voltage reference, and a bandgap voltage reference.

11. The method according to claim 8, wherein the integrated circuit device is a microcontroller.

12. A method for detecting a change in capacitance of an external capacitor with an integrated circuit device, said method comprising the steps of:

using only a sample and hold capacitor of an analog-to-digital converter (ADC) within the integrated circuit device to measure an external capacitance by the stops of:

(a) coupling a first terminal of the sample and hold capacitor with a reference voltage while grounding a second terminal of the sample and hold capacitor;

(b) discharging an external capacitor with a first switch in the integrated circuit device;

(c) coupling the first terminal of the sample and hold capacitor with a first terminal of the external capacitor with a second switch in the integrated circuit device while grounding a second terminal of the external capacitor so that some of the charge on the sample and hold capacitor is transferred to the external capacitor;

(d) de-coupling the sample and hold capacitor from the external capacitor and measuring a voltage on the first terminal of the sample and hold capacitor with an analog-to-digital converter (ADC) in the integrated circuit device;

(e) comparing the measured voltage on the sample and hold capacitor to a previously measured voltage with a digital processor in the integrated circuit device, wherein if the measured voltage is substantially the same as the previously measured voltage then repeat steps (a) to (e) and if the measured voltage is different than the previously measured voltage then indicate with an output from the integrated circuit device that a change of capacitance of the external capacitor has occurred; and (f) continue to repeat steps (a) to (e).

13. The method according to claim 12, wherein the previously measured voltage is stored in a memory in the integrated circuit device.

14. The method according to claim 13, further comprising the step of controlling the memory and ADC with the digital processor.

15. The method according to claim 14, wherein the integrated circuit device is a microcontroller.

16. The method according to claim 12, wherein the reference voltage is selected from the group consisting of a power supply voltage, a divided power supply voltage, an external voltage reference, and a bandgap voltage reference.

17. A method for detecting changes in capacitance of a plurality of external capacitors with an integrated circuit device, said method comprising the steps of:

using only a sample and hold capacitor of an analog-to-digital converter (ADC) within the integrated circuit device to measure an external capacitance by the steps of:

(a) coupling a first terminal of the sample and hold capacitor in an integrated circuit device with a reference voltage while grounding a second terminal of the sample and hold capacitor;

(b) discharging an external capacitor(n) of a plurality of external capacitors with a first switch in the integrated circuit device, where n is an integer number from 0 to m;

(c) coupling the first terminal of the sample and hold capacitor with a first terminal of the external capacitor (n) with a second switch in the integrated circuit device while grounding a second terminal of the external capacitor so that some of the charge on the sample and hold capacitor is transferred to the external capacitor(n);

(d) de-coupling the sample and hold capacitor from the external capacitor and measuring a voltage(n) on the first terminal of the internal capacitor with an analog-to-digital converter (ADC) in the integrated circuit device;

(e) comparing the measured voltage(n) on the sample and hold capacitor to a previously measured voltage(n) with a digital processor in the integrated circuit device, wherein if the measured voltage(n) is substantially the same as the previously measured voltage(n) then go to step (f), and if the measured voltage(n) is different than the previously measured voltage then indicate that a change of capacitance of the external capacitor(n) has occurred;

(f) determining if n is equal to m, wherein
if n is equal to m then make n zero (0), and
if n is less than m then increment n by one (1); and (g) repeating steps (a) through (f).

18. The method according to claim 17, wherein the previously measured voltage(n) is stored in a memory in the integrated circuit device.

19. The method according to claim 17, further comprising the step of controlling the memory and ADC with the digital processor.

20. The method according to claim 17, wherein the integrated circuit device is a microcontroller.

21. The method according to claim 17, wherein the plurality of external capacitors comprise a capacitive sensor touch panel.

22. The method according to claim 17, wherein the reference voltage is selected from the group consisting of a power supply voltage, a divided power supply voltage, an external voltage reference, and a bandgap voltage reference.

23. An apparatus for detecting actuation of capacitive touch sensor keys of a keypad, comprising:

a keypad matrix comprising a plurality of capacitive touch sensor keys;

an integrated circuit device comprising a multiplexer, a capacitive sensing circuit, a voltage reference, an analog-to-digital converter (ADC) comprising a sample and hold capacitor and a digital processor;

wherein the apparatus is configured:

(a) to couple a first terminal of the sample and hold capacitor of the ADC with a reference voltage by the capacitive sensing circuit while grounding a second terminal of the internal capacitor;

(b) to discharge an external capacitor(n) of a plurality of capacitive touch sensor keys by the capacitive sensing circuit, where n is an integer number from 0 to m;

(c) to couple the first terminal of the sample and hold capacitor of the ADC to a first terminal of the external capacitor(n) by the capacitive sensing circuit while grounding a second terminal of the external capacitor(n) so that some of the charge on the sample and hold capacitor is transferred to the external capacitor(n);

(d) to de-couple the sample and hold capacitor from the external capacitor and to measure by the ADC a voltage (n) on the first terminal of the sample and hold capacitor;

(e) to compare the measured voltage(n) on the first terminal of the sample and hold capacitor to a previously measured voltage(n) with the digital processor in the integrated circuit device; wherein if the measured voltage(n) is substantially the same as the previously measured voltage(n) then go to (f), and if the measured voltage(n) is different than the previously measured voltage then an indication is made that a change of capacitance of the external capacitor(n) of the plurality of capacitive touch sensor keys has occurred;

(f) if n is equal to m then make n zero (0), and
if n is less than m then increment n by one (1); and (g) repeat (a) through (f).

* * * * *

UNITED STATES PATENT AND TRADEMARK OFFICE
CERTIFICATE OF CORRECTION

| | |
|---|---|
| PATENT NO. | : 8,836,350 B2 |
| APPLICATION NO. | : 12/642347 |
| DATED | : September 16, 2014 |
| INVENTOR(S) | : Dieter Peter |

Page 1 of 1

It is certified that error appears in the above-identified patent and that said Letters Patent is hereby corrected as shown below:

In the Claims

Column 12,
line 47 "...device to measure an external capacitance by the stops..."
---Change to--- "...device to measure an external capacitance by the steps..."

Signed and Sealed this
Thirtieth Day of December, 2014

Michelle K. Lee
*Deputy Director of the United States Patent and Trademark Office*